(12) United States Patent
Lim et al.

(10) Patent No.: US 9,099,170 B2
(45) Date of Patent: Aug. 4, 2015

(54) SEMICONDUCTOR DEVICES INCLUDING PIPE LATCH UNITS AND SYSTEM INCLUDING THE SAME

(71) Applicant: SK hynix Inc., Icheon-si Gyeonggi-do (KR)

(72) Inventors: Yu Ri Lim, Daejeon (KR); Jae Il Kim, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 103 days.

(21) Appl. No.: 14/025,929

(22) Filed: Sep. 13, 2013

(65) Prior Publication Data

US 2014/0347939 A1 Nov. 27, 2014

(30) Foreign Application Priority Data

May 23, 2013 (KR) .................. 10-2013-0058629

(51) Int. Cl.
*G11C 7/22* (2006.01)
*G11C 7/10* (2006.01)
*G11C 11/4096* (2006.01)
*G11C 11/4093* (2006.01)
*G11C 11/4076* (2006.01)
*G11C 29/02* (2006.01)

(52) U.S. Cl.
CPC .............. *G11C 7/1066* (2013.01); *G11C 7/106* (2013.01); *G11C 7/10* (2013.01); *G11C 7/22* (2013.01); *G11C 7/222* (2013.01); *G11C 11/4076* (2013.01); *G11C 29/023* (2013.01)

(58) Field of Classification Search
CPC ........ G11C 7/22; G11C 7/222; G11C 29/023; G11C 7/10; G11C 7/1066; G11C 7/106; G11C 11/4076
USPC .................. 365/189.05, 191, 193, 194, 233.1, 365/233.13
See application file for complete search history.

(56) References Cited

U.S. PATENT DOCUMENTS

| | | | | |
|---|---|---|---|---|
| 6,111,810 | A  * | 8/2000 | Fujita | 365/230.06 |
| 7,983,101 | B2 * | 7/2011 | Na et al. | 365/193 |
| 2012/0026806 | A1 * | 2/2012 | Kwon | 365/189.07 |
| 2012/0154186 | A1 | 6/2012 | Hassan | |

FOREIGN PATENT DOCUMENTS

KR 1020090126774 A 12/2009

* cited by examiner

*Primary Examiner* — Ly D Pham
(74) *Attorney, Agent, or Firm* — William Park & Associates Ltd.

(57) ABSTRACT

The semiconductor device includes a pre-signal generator and a data output portion. The pre-signal generator generates a pre-input control signal and a pre-output control signal. The pre-signal generator also generates a pre-latch pulse signal by detecting when the pre-input control signal and the pre-output control signal are generated. The data output portion receives an input control signal, a latch pulse signal, and a first output control signal. The data output portion receives an input clock signal in response to the input control signal and the latch pulse signal to generate a shift clock signal, and the data output portion also shifts the first output control signal in response to the shift clock signal to generate a second output control signal.

11 Claims, 7 Drawing Sheets

SEMICONDUCTOR DEVICES INCLUDING PIPE LATCH UNITS AND SYSTEM INCLUDING THE SAME

CROSS-REFERENCE TO RELATED APPLICATION

The present application claims priority under 35 U.S.C. 119(a) to Korean Application No. 10-2013-0058629, filed on May 23, 2013, in the Korean Intellectual Property Office, which is incorporated herein by reference in its entirety.

BACKGROUND

Embodiments of the present disclosure relate generally to semiconductor devices and, more particularly, to semiconductor devices including pipe latch units.

In general, double data rate 2 (hereinafter referred to as "DDR2") synchronous dynamic random access memory (hereinafter referred to as "SDRAM") devices may successively receive a plurality of commands from external devices. Even in this case, however, operations corresponding to the commands are not immediately executed in the DDR2 SDRAM device. When the DDR2 SDRAM devices are under a write operation mode, column address strobe (hereinafter referred to as "CAS") signals should be activated. Therefore, the DDR2 SDRAM devices that successively received a plurality of commands including a read command may secure an execution time for various other operations by delaying a point when the CAS is activated. A delay time from input of a read command till an activation of the CAS is referred to as an additive latency (hereinafter referred to as "AL"). Further, a CAS latency (hereinafter referred to as "CL") denotes a delay time from the activation of the CAS till output of valid data. That is, a read latency (hereinafter referred to as "RL") from the input of the read command till the output of the valid data may correspond to a sum of the AL and the CL. The AL and the CAS may be represented by the number of clock cycles.

The DDR2 SDRAM device may store the data, outputted from cell array blocks by the read command, in a latch circuit and may output the data stored in the latch circuit through the output pins at a point when the CL terminates. This is for preventing the data from colliding with each other when at least one of the data is outputted from cell array blocks earlier than a predetermined CL.

A plurality of data bits may be outputted by applying the read command once, and the number of data bits outputted consecutively may be determined by a burst length (hereinafter referred to as "BL") of a mode register set (hereinafter referred to as "MRS"). Further, an output sequence of the data may also be determined by a burst type of the MRS. Therefore, a data output mode of the DDR2 SDRAM devices may be categorized as either an interleave mode or a sequential mode according to the burst type of the MRS, and the output sequence of the data may vary according to the data output mode.

The DDR2 SDRAM devices may use a four-bit pre-fetch scheme that transmits four bits per one data pin through a global data I/O line (hereinafter referred to as "GIO") in a read operation mode. The pre-fetch scheme is used to overcome limitations in improving an operation speed of core region of the semiconductor devices, for example, the DDR2 SDRAM devices. The pre-fetch scheme allows data to be processed in parallel in the core region of the semiconductor devices and outputted in series through an interface between the semiconductor devices and external devices. The pre-fetch scheme may be realized by a pre-fetch circuit including a plurality of pipe latch units.

SUMMARY

Example embodiments are directed to semiconductor devices employing pipe latched input/output (I/O) schemes.

According to some embodiments, a semiconductor device includes a pre-signal generator and a data output portion. The pre-signal generator generates a pre-input control signal and a pre-output control signal and also detects generation moments of the pre-input control signal and the pre-output control signal to generate a pre-latch pulse signal. The data output portion receives an input control signal provided by a first transmission line through which the pre-input control signal is transmitted, a latch pulse signal provided by a second transmission line through which the pre-latch pulse signal is transmitted, and a first output control signal provided by a third transmission line through which the pre-output control signal is transmitted. The data output portion receives an input clock signal in response to the input control signal and the latch pulse signal to generate a shift clock signal, and the data output portion also shifts the first output control signal in response to the shift clock signal to generate a second output control signal.

According to further embodiments, a semiconductor device includes a latch pulse generator detecting generation moments of an input control signal and a first output control signal to generate a latch pulse signal, a clock latch controller latching the input control signal in response to the latch pulse signal to generate a latch signal and receiving an internal clock signal in response to the latch signal to generate a shift clock signal, and an output control signal generator shifting the first output control signal to generate a second output control signal when the shift clock signal is generated.

According to an embodiment of the present invention, a system includes a controller configured to provide an input/output strobe signal and an output enable signal and a pre-signal generator configured to generate a pre-input control signal, a pre-latch pulse signal and a pre-output control signal in response to the input/output strobe signal and the output enable signal. The system also includes a data output portion configured to receive an input control signal generated from the pre-input control signal, a latch pulse signal generated from the pre-latch pulse signal, a first output control signal generated from the pre-output control signal, and an input clock signal and configured to generate a shift clock signal and shift the first output control signal in response to the shift clock signal to generate a second output control signal.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments of the inventive concept will be described hereinafter with reference to the accompanying drawings. However, the example embodiments described herein are for illustrative purposes only and are not intended to limit the scope of the inventive concept.

Figure 1:
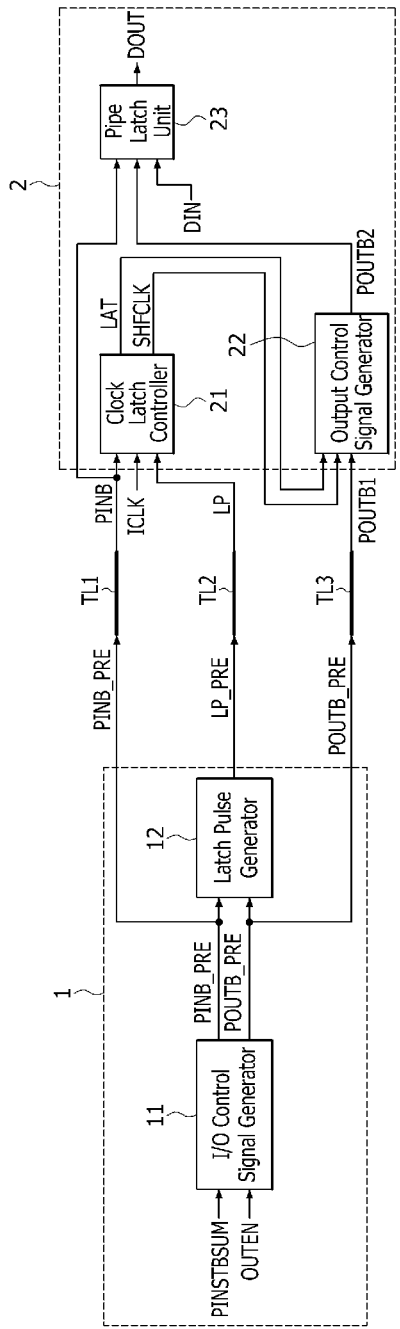
FIG. 1 is a block diagram illustrating a configuration of a semiconductor device according to some embodiments of the present invention.

As illustrated in FIG. 1, a semiconductor device according to some embodiments of the present invention may be configured to include a pre-signal generator 1 and a data output portion 2. The pre-signal generator 1 may be configured to include an I/O control signal generator 11 and a latch pulse generator 12. The data output portion 2 may be configured to include a clock latch controller 21, an output control signal generator 22 and a pipe latch unit 23. A pre-input control signal PINB_PRE generated in the pre-signal generator 1 may be transmitted through a first transmission line TL1 to provide an input control signal PINB, and the input control signal PINB may be applied to the data output portion 2. A pre-latch pulse signal LP_PRE generated in the pre-signal generator 1 may be transmitted through a second transmission line TL2 to provide a latch pulse signal LP, and the latch pulse signal LP may be applied to the data output portion 2. A pre-output control signal POUTB_PRE generated in the pre-signal generator 1 may be transmitted through a third transmission line TL3 to provide a first output control signal POUTB1, and the first output control signal POUTB1 may be applied to the data output portion 2.

The I/O control signal generator 11 may generate the pre-input control signal PINB_PRE and the pre-output control signal POUTB_PRE in response to an I/O strobe signal PINSTBSUM and an output enable signal OUTEN. In an embodiment of the present invention, the I/O control signal generator 11 may generate the pre-input control signal PINB_PRE when the I/O strobe signal PINSTBSUM is enabled and may generate the pre-output control signal POUTB_PRE when the output enable signal OUTEN is enabled. The I/O strobe signal PINSTBSUM may be enabled in synchronization with a time period between when data stored in memory cells are outputted and when the data reach a pipe latch unit. In an embodiment of the present invention, the I/O strobe signal PINSTBSUM may be enabled at least during a time period between when data stored in memory cells are outputted and when the data reach a pipe latch unit. The output enable signal OUTEN may be enabled in synchronization with information of a CAS latency (CL). The CL may be set by an operation of a mode register set (MRS) and may be defined as a time between a moment that a CAS signal is generated and a moment that data are outputted. Since the output enable signal OUTEN is enabled based on the information of the CL set by the MRS, a point when the output enable signal OUTEN is enabled may be fixed. In contrast, a point when the I/O strobe signal PINSTBSUM is enabled may vary according to change in a time period between when data stored in memory cells are outputted and when the data reach a pipe latch unit. Thus, a point when the pre-output control signal POUTB_PRE is generated may be fixed, whereas a point when the pre-input control signal PINB_PRE is generated may vary according to when the data are outputted.

The latch pulse generator 12 may detect when the pre-input control signal PINB_PRE and the pre-output control signal POUTB_PRE are generated, thereby generating the pre-latch pulse signal LP_PRE. In an embodiment of the present invention, the latch pulse generator 12 may generate the pre-latch pulse signal LP_PRE having a pulse width that corresponds to a time period from a generation of the pre-input control signal PINB_PRE to a generation of the pre-output control signal POUTB_PRE when the pre-input control signal PINB_PRE is generated earlier than a generation of the pre-output control signal POUTB_PRE. Alternatively, the latch pulse generator 12 may generate the pre-latch pulse signal LP_PRE having a pulse width that corresponds to a time period from a generation of the pre-output control signal POUTB_PRE to a generation of the pre-input control signal PINB_PRE when the pre-input control signal PINB_PRE is generated later than a generation of the pre-output control signal POUTB_PRE.

The clock latch controller 21 may generate a latch signal LAT and a shift clock signal SHFCLK in response to the input control signal PINB, the latch pulse signal LP, and an internal clock signal ICLK. For example, the clock latch controller 21 may latch the pre-input control signal PINB_PRE in response to the latch pulse signal LP to generate the latch signal LAT and may receive the internal clock signal ICLK in response to the latch signal LAT to generate a shift clock signal SHFCLK. In an embodiment of the present invention, the clock latch controller 21 may generate the latch signal LAT having a logic "high" level at a point delayed by a predetermined period from a point when the latch pulse signal LP is generated, when the input control signal PINB has a logic "high" level. Further, the clock latch controller 21 may generate the shift clock signal SHFCLK using the internal clock signal ICLK while the latch signal LAT has a logic "high" level.

The output control signal generator 22 may shift the first output control signal POUTB1 by a predetermined period to output it as a second output control signal POUTB2 when the shift clock signal SHFCLK, which is toggled, is inputted during a period that the latch pulse signal LP is generated. The shifted period in the output control signal generator 22 may be set to have different values according to the embodiments.

The pipe latch unit 23 may latch input data DIN in synchronization with the input control signal PINB. Further, the pipe latch unit 23 may output the latched data as output data DOUT in synchronization with the second output control signal POUTB2. Even though the pre-input control signal PINB_PRE is generated later than a generation of the pre-output control signal POUTB_PRE, the first output control signal POUTB1 may be shifted to provide the second output control signal POUTB2 which is generated later than a generation of the input control signal PINB. Thus, a malfunction that the output data DOUT are outputted before the input data DIN are latched may not occur.

Figure 2:
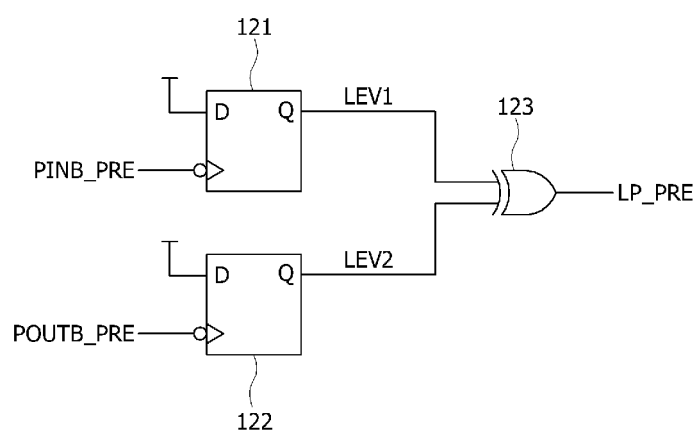
FIG. 2 is a circuit diagram illustrating an example of a latch pulse generator included in the semiconductor device of FIG. 1.

Referring to FIG. 2, the latch pulse generator 12 may be configured to include a first latch unit 121, a second latch unit 122 and a logic unit 123. The first latch unit 121 may latch a power supply voltage signal to generate a first level signal LEV1 whose level is transitioned from a logic "low" level to a logic "high" level at a falling edge of the pre-input control signal PINB_PRE. The second latch unit 122 may latch the power supply voltage signal to generate a second level signal LEV2 whose level is transitioned from a logic "low" level to a logic "high" level at a falling edge of the pre-output control signal POUTB_PRE. The logic unit 123 may generate the pre-latch pulse signal LP_PRE having a pulse width that corresponds to a time period which is enabled into a logic "high" level while the first and second level signals LEV1 and LEV2 have different logic levels from each other. In an embodiment of the present invention, the first and second latch units 121 and 122 may be realized using flip flops, and the logic unit 123 may be realized using an exclusive OR (XOR) gate that executes an exclusive OR (XOR) operation.

Figure 3:
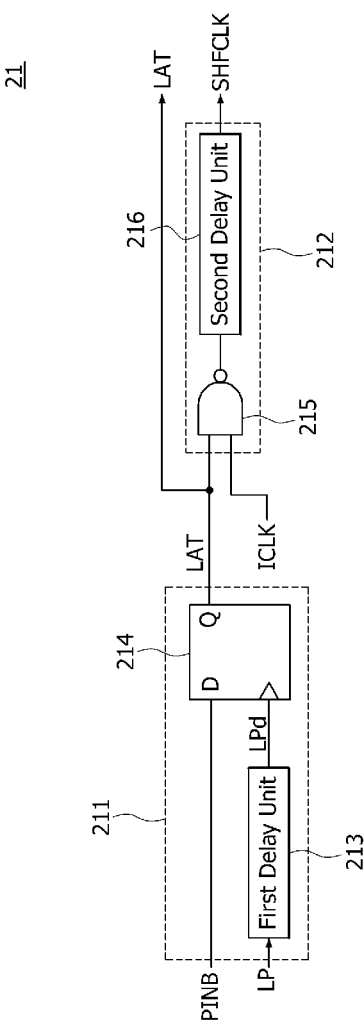
FIG. 3 is a schematic diagram illustrating an example of a clock latch controller included in the semiconductor device of FIG. 1.

Referring to FIG. 3, the clock latch controller 21 may be configured to include a latch signal generator 211 and a clock output unit 212. The latch signal generator 211 may be configured to include a first delay unit 213 and a third latch unit 214. The clock output unit 212 may be configured to include a buffer 215 and a second delay unit 216. The first delay unit 213 may retard the latch pulse signal LP by a first delay time to generate a delayed latch pulse signal LPd. The third latch unit 214 may latch the input control signal PINB to generate the latch signal LAT at a point when the delayed latch pulse signal LPd is inputted thereto. The buffer 215 may invert the internal clock signal ICLK while the latch signal LAT has a logic "high" level. The second delay unit 216 may retard an output signal of the buffer 215 by a second delay time to generate the shift clock signal SHFCLK. The first delay time and the second delay time may be set to have various values according to various embodiments of the present invention. At least one of the first and second delay units 213 and 216 may be removed according to an embodiment of the present invention. In an embodiment of the present invention, the third latch unit 214 may be realized using a flip flop.

Figure 4:
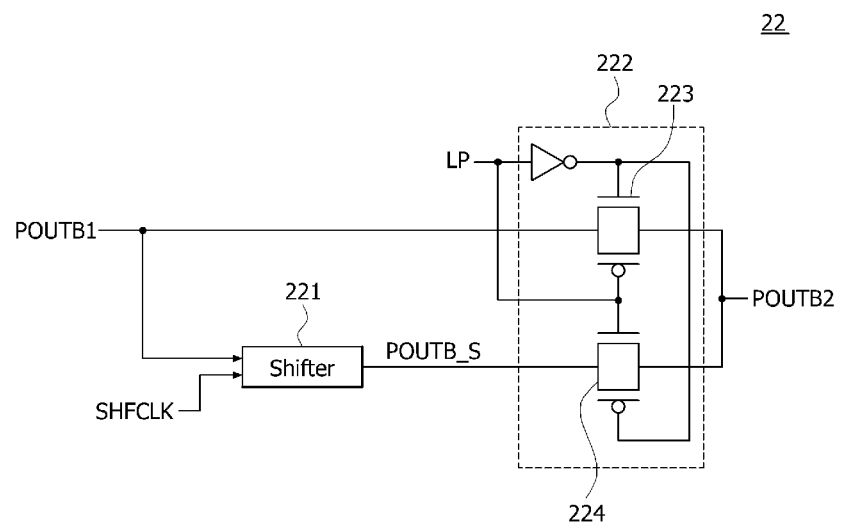
FIG. 4 is a schematic diagram illustrating an example of an output control signal generator included in the semiconductor device of FIG. 1.

Referring to FIG. 4, the output control signal generator 22 may be configured to include a shifting unit 221 and a selection output unit 222. The shifting unit 221 may shift the first output control signal POUTB1 by a predetermined period to output it as a shifted signal POUTB_S when the shift clock signal SHFCLK, which is toggled, is inputted. The selection output unit 222 may be configured to include transfer gates 223 and 224 which are selectively turned on in response to the latch pulse signal LP. For example, the selection output unit 222 may output the first output control signal POUTB1 as the second output control signal POUTB2 while the latch pulse signal LP has a logic "low" level and may output the shifted signal POUTB_S as the second output control signal POUTB2 while the latch pulse signal LP has a logic "high" level.

An operation of the semiconductor device set forth above will be described with reference to FIGS. 5 and 6 in conjunction with an example that the pre-input control signal PINB_PRE is generated earlier than a generation of the pre-output control signal POUTB_PRE and an example that the pre-input control signal PINB_PRE is generated later than a generation of the pre-output control signal POUTB_PRE.

Figure 5:
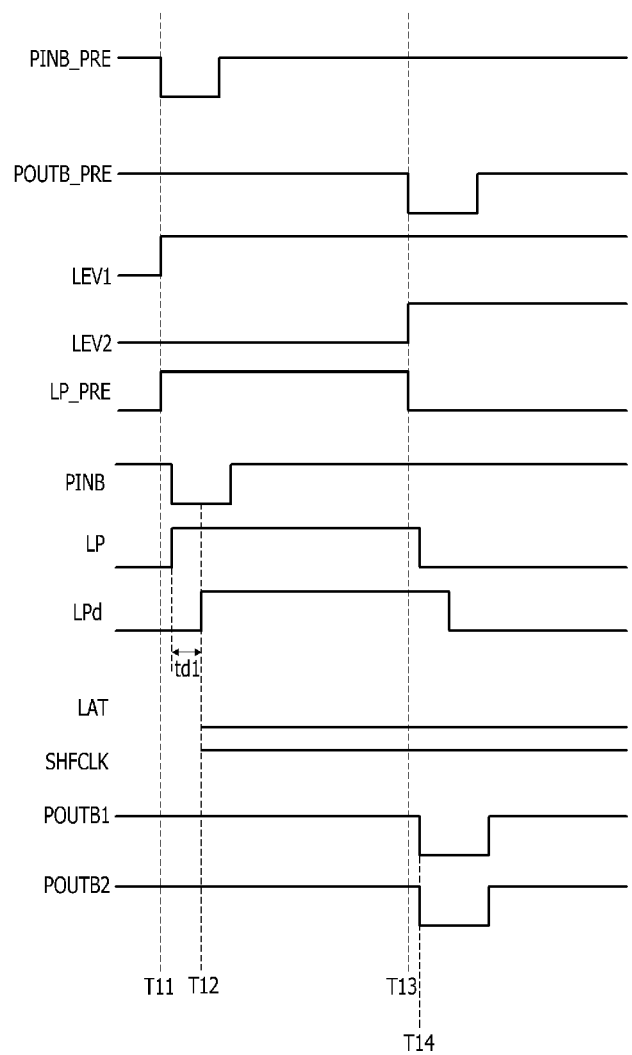
FIGS. 5 and 6 are timing diagrams illustrating an operation of the semiconductor device shown in FIGS. 1, 2, 3 and 4.

As illustrated in FIG. 5, when the pre-output control signal POUTB_PRE is generated at a point of time T13 after the pre-input control signal PINB_PRE is generated at a point of time T11, a level of the first level signal LEV1 may be transitioned from a logic "low" level into a logic "high" level at the point of time T11 and a level of the second level signal LEV2 may be transitioned from a logic "low" level into a logic "high" level at the point of time T13. Thus, the pre-latch pulse signal LP_PRE may have a logic "high" level during a period between the points of time T11 and T13. The pre-input control signal PINB_PRE, the pre-latch pulse signal LP_PRE and the pre-output control signal POUTB_PRE generated as set forth above may be transmitted through respective ones of the first, second and third transmission lines TL1, TL2 and TL3 to provide the input control signal PINB, the latch pulse signal LP and the first output control signal POUTB1 which are applied to the data output portion 2. The input control signal PINB may has a logic "low" level at a point of time T12 that the delayed latch pulse signal LPd generated by retarding the latch pulse signal LP by a predetermined delay time Td1 is generated to have a logic "high" level. Thus, the latch signal LAT may have a logic "low" level from the point of time T12, and the shift clock signal SHFCLK may have a logic "high" level from the point of time T12 regardless of a level of the internal clock signal ICLK. Because the shift clock signal SHFCLK is not toggled, the first and second output control signals POUTB1 and POUTB2 may be simultaneously generated at a point of time T14.

Figure 6:
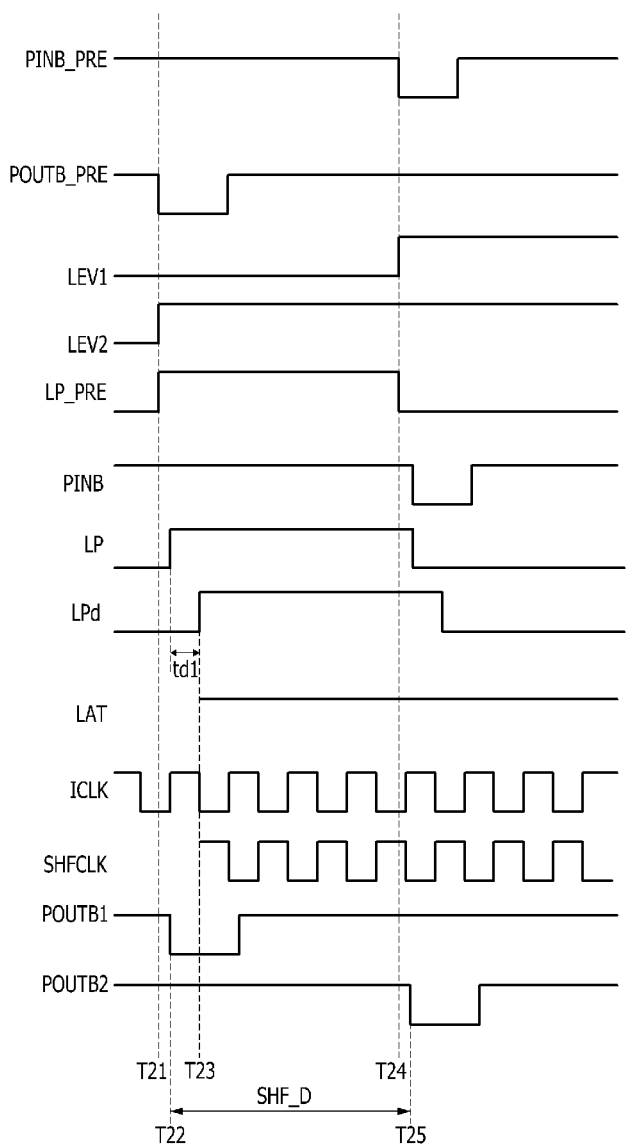

As illustrated in FIG. 6, when the pre-input control signal PINB_PRE is generated at a point of time T24 after the pre-output control signal POUTB_PRE is generated at a point of time T21, a level of the first level signal LEV1 may be transitioned from a logic "low" level into a logic "high" level at the point of time T24 and a level of the second level signal LEV2 may be transitioned from a logic "low" level into a logic "high" level at the point of time T21. Thus, the pre-latch pulse signal LP_PRE may have a logic "high" level during a period between the points of time T21 and T24. The pre-input control signal PINB_PRE, the pre-latch pulse signal LP_PRE and the pre-output control signal POUTB_PRE generated as set forth above may be transmitted through respective ones of the first, second and third transmission lines TL1, TL2 and TL3 to provide the input control signal PINB, the latch pulse signal LP and the first output control signal POUTB1 which are applied to the data output portion 2. The input control signal PINB may has a logic "high" level at a point of time T23 that the delayed latch pulse signal LPd generated by retarding the latch pulse signal LP by a predetermined delay time Td1 is generated to have a logic "high" level. Thus, the latch signal LAT may be generated to have a logic "high" level from the point of time T23, and the internal clock signal ICLK may be inverted to generate the shift clock signal SHFCLK from the point of time T23. Because the shift clock signal SHFCLK is generated to be toggled from the point of time T23, the first output control signal POUTB1 may be retarded by a predetermined shift period SHF_D to generate the second output control signal POUTB2.

As described above, even though the pre-input control signal PINB_PRE is generated later than a generation of the pre-output control signal POUTB_PRE, the semiconductor device according to an embodiment of the present invention may operate such that data are outputted from the pipe latch unit 23 using the second output control signal POUTB2 which is generated by shifting the first output control signal POUTB1 in response to the shift clock signal SHFCLK. Thus, even though a time period between when data stored in memory cells are outputted and when the data reach a pipe latch unit is changed, a malfunction that the data are outputted before the pipe latch unit 23 latches the data may not occur.

Figure 7:
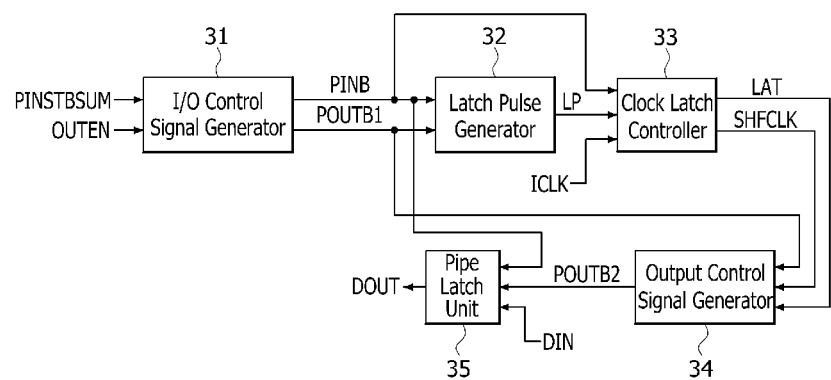
FIG. 7 is a block diagram illustrating a configuration of another semiconductor device according to some embodiments of the present invention.

As illustrated in FIG. 7, a semiconductor device according to some embodiments of the present invention may be configured to include an I/O control signal generator 31, a latch pulse generator 32, a clock latch controller 33, an output control signal generator 34 and a pipe latch unit 35.

The I/O control signal generator 31 may generate an input control signal PINB and a first output control signal POUTB1 in response to an I/O strobe signal PINSTBSUM and an output enable signal OUTEN. In an embodiment of the present invention, the I/O control signal generator 31 may generate the input control signal PINB when the I/O strobe signal PINSTBSUM is enabled and may generate the first output control signal POUTB1 when the output enable signal OUTEN is enabled. The I/O strobe signal PINSTBSUM may be enabled in synchronization with a time period between when data stored in memory cells are outputted and when the data reach a pipe latch unit. In an embodiment of the present invention, the I/O strobe signal PINSTBSUM may be enabled at least during a time period between when data stored in memory cells are outputted and when the data reach a pipe latch unit. The output enable signal OUTEN may be enabled in synchronization with information of a CAS latency (CL). The CL may be set by an operation of a mode register set (MRS) and may be defined as a time between a moment that a CAS signal is generated and a moment that data are outputted. Since the output enable signal OUTEN is enabled based on the information of the CL set by the MRS, a point when the output enable signal OUTEN is enabled may be uniformly maintained. In contrast, a point when the I/O strobe signal PINSTBSUM is enabled may vary according to change in a time period between when data stored in memory cells are outputted and when the data reach a pipe latch unit. Thus, a point when the first output control signal POUTB1 is generated may be fixed, whereas a point when the input control signal PINB is generated may vary according to when the data are outputted.

The latch pulse generator 32 may detect when the input control signal PINB and the first output control signal POUTB1 are generated, thereby generating a latch pulse signal LP. In an embodiment of the present invention, the latch pulse generator 32 may generate the latch pulse signal LP having a pulse width that corresponds to a time period from a generation of the input control signal PINB to a generation of the first output control signal POUTB1 when the input control signal PINB is generated earlier than a generation of the first output control signal POUTB1. Alternatively, the latch pulse generator 32 may generate the latch pulse signal LP having a pulse width that corresponds to a time period from a generation of the first output control signal POUTB1 to a generation of the input control signal PINB when the input control signal PINB is generated later than a generation of the first output control signal POUTB1. The latch pulse generator 32 may have substantially the same configuration as the latch pulse generator 12 illustrated in FIG. 2. That is, the latch pulse generator 32 may include a first latch unit that latches a power supply voltage signal in response to the input control signal PINB to generate a first level signal, a second latch unit that latches the power supply voltage signal in response to the first output control signal POUTB1 to generate a second level signal, and a logic unit that generates the latch pulse signal LP having a pulse width which corresponds to a time period that the first and second level signals have different logic levels from each other.

The clock latch controller 33 may generate a latch signal LAT and a shift clock signal SHFCLK in response to the input control signal PINB, the latch pulse signal LP and an internal clock signal ICLK. For example, the clock latch controller 33 may latch the input control signal PINB in response to the latch pulse signal LP to generate the latch signal LAT and may receive the internal clock signal ICLK in response to the latch signal LAT to generate a shift clock signal SHFCLK. In an embodiment of the present invention, the clock latch controller 33 may generate the latch signal LAT having a logic "high" level at a point delayed by a predetermined period from a point when the latch pulse signal LP is generated, when the input control signal PINB has a logic "high" level. Further, the clock latch controller 33 may generate the shift clock signal SHFCLK using the internal clock signal ICLK while the latch signal LAT has a logic "high" level. The clock latch controller 33 may have substantially the same configuration as the clock latch controller 21 illustrated in FIG. 3.

The output control signal generator 34 may shift the first output control signal POUTB1 by a predetermined period to output it as a second output control signal POUTB2 when the shift clock signal SHFCLK, which is toggled, is inputted during a period that the latch pulse signal LP is generated. The shifted period in the output control signal generator 34 may vary according to various embodiments of the present invention. The output control signal generator 34 may have substantially the same configuration as the output control signal generator 22 illustrated in FIG. 4.

The pipe latch unit 35 may latch input data DIN in synchronization with the input control signal PINB. Further, the pipe latch unit 35 may output the latched data as output data DOUT in synchronization with the second output control signal POUTB2. Even though the input control signal PINB is generated later than a generation of the first output control signal POUTB1, the first output control signal POUTB1 may be shifted to provide the second output control signal POUTB2 which is generated later than a generation of the input control signal PINB. Thus, a malfunction that the output data DOUT are outputted before the input data DIN are latched may not occur.

As described above, when the input control signal PINB is generated later than a generation of the first output control signal POUTB1, the semiconductor device according to an embodiment of the present invention may operate such that data are outputted from the pipe latch unit 35 using the second output control signal POUTB2 which is generated by shifting the first output control signal POUTB1 in response to the shift clock signal SHFCLK. Thus, even though a time period between when data stored in memory cells are outputted and when the data reach a pipe latch unit is changed, a malfunction that the data are outputted before the pipe latch unit 35 latches the data may not occur.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
a pre-signal generator configured to generate a pre-input control signal and a pre-output control signal and configured to generate a pre-latch pulse signal by detecting when the pre-input control signal and the pre-output control signal are generated; and
a data output portion configured to receive an input control signal provided by a first transmission line through which the pre-input control signal is transmitted, a latch pulse signal provided by a second transmission line through which the pre-latch pulse signal is transmitted, and a first output control signal provided by a third transmission line through which the pre-output control signal is transmitted,
wherein the data output portion receives an input clock signal in response to the input control signal and the latch pulse signal to generate a shift clock signal, and wherein the data output portion shifts the first output control signal in response to the shift clock signal to generate a second output control signal.

2. The semiconductor device of claim 1, wherein the pre-latch pulse signal has a pulse width that corresponds to one of a time period from a generation of the pre-input control signal to a generation of the pre-output control signal and a time period from a generation moment of the pre-output control signal to a generation moment of the pre-input control signal.

3. The semiconductor device of claim 1, wherein the pre-signal generator includes:
   an input/output control signal generator configured to generate the pre-input control signal and the pre-output control signal in response to an input/output strobe signal and an output enable signal; and
   a latch pulse generator configured to generate the pre-latch pulse signal in response to the pre-input control signal and the pre-output control signal.

4. The semiconductor device of claim 3, wherein the input/output strobe signal is enabled in synchronization with a time period between when data stored in memory cells are outputted and when the data reach a pipe latch unit and the output enable signal is enabled in synchronization with latency information.

5. The semiconductor device of claim 4, wherein the latency information is defined as a time from a generation of a column address strobe signal to an output of the data and is set by a mode register set operation.

6. The semiconductor device of claim 3, wherein the latch pulse generator includes:
   a first latch unit configured to latch a power supply voltage signal in response to the pre-input control signal to output a first level signal;
   a second latch unit configured to latch the power supply voltage signal in response to the pre-output control signal to output a second level signal; and
   a logic unit configured to generate the pre-latch pulse signal having a pulse width which corresponds to a time period that the first and second level signals have different logic levels from each other.

7. The semiconductor device of claim 1, wherein the data output portion includes:
   a clock latch controller configured to latch the input control signal in response to the latch pulse signal to generate a latch signal and configured to receive the internal clock signal in response to the latch signal to generate the shift clock signal; and
   an output control signal generator configured to shift the first output control signal to generate a second output control signal when the shift clock signal is generated.

8. The semiconductor device of claim 7, wherein the clock latch controller includes:
   a latch signal generator configured to retard the latch pulse signal to generate a delayed latch pulse signal and configured to latch the input control signal in synchronization with the delayed latch pulse signal to generate the latch signal; and
   a clock output unit configured to receive the internal clock signal to generate the shift clock signal while the latch signal is enabled.

9. The semiconductor device of claim 7, wherein the output control signal generator includes:
   a shifter configured to shift the first output control signal by a predetermined period in synchronization with the shift clock signal to output a shifted signal; and
   a selection output unit configured to selectively output one of the first output control signal and the shifted signal as the second output control signal in response to the latch pulse signal.

10. The semiconductor device of claim 7, wherein the data output portion further includes a pipe latch unit configured to receive and latch an input data in response to the input control signal and configured to output the latched input data in response to the second output control signal.

11. A system comprising: and an output enable signal;
   a pre-signal generator configured to generate a pre-input control signal, a pre-latch pulse signal and a pre-output control signal in response to the input/output strobe signal and the output enable signal; and
   a data output portion configured to receive an input control signal generated from the pre-input control signal, a latch pulse signal generated from the pre-latch pulse signal, a first output control signal generated from the pre-output control signal, and an input clock signal and configured to generate a shift clock signal and shift the first output control signal in response to the shift clock signal to generate a second output control signal.

* * * * *